United States Patent [19]

Yoshinouchi et al.

[11] Patent Number: 5,403,756
[45] Date of Patent: Apr. 4, 1995

[54] METHOD OF PRODUCING A POLYCRYSTALLINE SEMICONDUCTOR FILM WITHOUT ANNEALING, FOR THIN FILM TRANSISTOR

[75] Inventors: Atsushi Yoshinouchi, Kashiba; Tatsuo Morita, Soraku; Shuhei Tsuchimoto, Kitakatsuragi; Yasuaki Murata, Tenri, all of Japan

[73] Assignee: Sharp Kabushiki Kaisha, Osaka, Japan

[21] Appl. No.: 158,592

[22] Filed: Nov. 24, 1993

Related U.S. Application Data

[63] Continuation-in-part of Ser. No. 978,942, Nov. 20, 1992, abandoned.

[30] Foreign Application Priority Data

| | | | |
|---|---|---|---|
| Nov. 20, 1991 | [JP] | Japan | 3-304573 |
| Jan. 30, 1992 | [JP] | Japan | 4-14473 |
| Aug. 6, 1992 | [JP] | Japan | 4-210302 |
| Nov. 17, 1992 | [JP] | Japan | 4-307350 |

[51] Int. Cl.$^6$ ......................... H01L 21/266
[52] U.S. Cl. ............................. 437/24; 437/46; 437/933; 437/937
[58] Field of Search .......... 437/21, 24, 40, 46, 437/151, 933, 934, 937, 959; 148/DIG. 1, DIG. 40, DIG. 128, DIG. 151

[56] References Cited

U.S. PATENT DOCUMENTS

| | | | |
|---|---|---|---|
| 4,943,837 | 7/1990 | Konishi et al. | 437/937 |
| 5,141,885 | 8/1992 | Yoshida et al. | 437/101 |
| 5,306,651 | 4/1994 | Masumo et al. | 437/40 |

FOREIGN PATENT DOCUMENTS

| | | |
|---|---|---|
| 63-119269 | 5/1988 | Japan . |
| 63-194326 | 8/1988 | Japan . |
| 64-53462 | 3/1989 | Japan . |
| 3-159119 | 7/1991 | Japan . |
| 2167899 | 6/1986 | United Kingdom . |

OTHER PUBLICATIONS

Yoshida et al., "Fabrication of a-Si:H thin film transistors on 4-inch glass substrates by a large area ion doping technique" *Japanese Journal of Applied Physics* (1991) 30(1A):L67–L69.

Hajime, *Patent Abstracts of Japan* (12 Apr. 1988) vol. 12, No. 115, (E-599) p. 1/1, JP 62-245674.

Hirano et al., "Fabrication of polycrystalline silicon thin-film transistors by ion shower doping technique" *Electronics and Communications in Japan*, Part II: Electronics (1988) 71(10):40–45.

*Primary Examiner*—Brian E. Hearn
*Assistant Examiner*—Chandra Chaudhari
*Attorney, Agent, or Firm*—Morrison & Foerster

[57] ABSTRACT

A method for producing a polycrystalline semiconductor film is disclosed. The method includes the steps of: forming a semiconductor film on a substrate; forming a passivation film on the semiconductor film; exciting a mixed gas including hydrogen and at least one element selected from the group consisting of the III, IV, and V groups of the periodic table to generate hydrogen ions and ions of the at least one element; and implanting the hydrogen ions into the semiconductor film through the passivation film and simultaneously implanting the ions of the at least one element into the semiconductor film through the passivation film, thereby changing the semiconductor film into a polycrystalline semiconductor film having the at least one element.

18 Claims, 11 Drawing Sheets and rel1 5,403,756

METHOD OF PRODUCING A POLYCRYSTALLINE SEMICONDUCTOR FILM WITHOUT ANNEALING, FOR THIN FILM TRANSISTOR

CROSS REFERENCE TO RELATED APPLICATION

This application is a continuation-in-part of Application Ser. No. 07/978,942, now abandoned, filed on Nov. 20, 1992.

BACKGROUND OF THE INVENTION

1. Field of the Invention

The present invention relates to a semiconductor device such a thin film transistor, a method of fabricating the semiconductor device, a method of producing a polycrystalline semiconductor film, and a method of an ion implantation used in such fabrication.

2. Description of the Related Art

Recently, an apparatus such as an image sensor or a liquid crystal display has been developed in which a drive circuit is provided on one and the same substrate. As a result, there has been an increase in demand for fabricating thin film transistors on a transparent insulating substrate. Since image sensors, liquid crystal displays, and the like have become large-sized and the productivity thereof has been improved, the substrate on which thin film transistors are formed has become large. Accordingly, a semiconductor fabrication apparatus is desired which is capable of handling a substrate having a large area.

An extremely important step among the process steps for fabricating a semiconductor device is a step for introducing impurities into a semiconductor layer. The impurities can be introduced by thermal diffusion or ion implantation. For example, by using thermal diffusion, the impurities are introduced from the surface of the semiconductor layer. By using ion implantation, impurity ions are implanted. The ion implantation method provides a more precise control of total dopant concentration and a depth to which the impurities are implanted into the semiconductor layer. Moreover, when the ion implantation technique is used, impurities can be shallowly implanted into the semiconductor layer, and impurities can be implanted into the semiconductor layer through thin films which are formed on the semiconductor layer. Furthermore, ion implantation can be performed at low temperatures at which a glass substrate will not deform. For the above reasons, ion implantation is most often used for introducing impurities into a semiconductor layer.

Using a conventional ion implentation apparatus, ions are implanted using an ion beam having a diameter of only several millimeters. When the ions are to be implanted over a large substrate using the above conventional ion implantation apparatus, it is necessary to either move the substrate mechanically or scan the ion beam electrically over the substrate because the area of the substrate is large as compared to the diameter of the ion beam. The provision of a mechanical moving means or an electrical scanning means causes a problem in that the ion implantation apparatus becomes complicated, large-sized and expensive.

One technique for solving the above problem and in which ions can be implanted into a large area is disclosed in Japanese Laid-Open Patent Publication No. 63-194326. According to this technique, ions generated by using a plasma discharge as the ion source are accelerated at a low voltage without mass separating them, and are implanted into a substrate which has been heated to a predetermined temperature in a shower-like shape. The ion implantation in a shower like shape means that ions are implanted over the semiconductor layer at a time.

Generally, when impurities are introduced into a semiconductor layer using an ion implantation apparatus, it is necessary to anneal the ion-implanted semiconductor layer, in order to maintain an appropriate conductivity of the semiconductor layer. According to a conventional ion implantation method, ions generated by the ion source are allowed to pass through a mass spectrometer to eliminate ions unnecessary to the ion implantation, and only the selected ions are accelerated and implanted. In this conventional case, most of the implanted ions are not positioned in a lattice, and the ions have low carrier movability. Therefore, in order to activate the ions, it is necessary to heat-treat the ions at a high temperature. Especially when impurities are introduced into polysilicon by ion implantation, the polysilicon turns into amorphous silicon due to damage by implantation, so that the specific resistance rapidly rises (to $10^3$ $\Omega$·cm or higher). When the amorphous silicon is turned into polycrystalline silicon by annealing the amorphous silicon, the implanted impurities are taken into the silicon crystals to produce carriers. Therefore, it has been necessary to perform annealing after ion implantation to activate the ions.

Also, in the case where the technique disclosed in Japanese Laid-Open Patent Publication No. 63-194326 is used for implanting impurities into a thin polycrystalline silicon (hereafter, referred to as polysilicon) film so as to form thin film transistors, it is still necessary to anneal the thin polysilicon film at a high temperature in order to activate the implanted impurities.

Since thin film transistors are formed on a transparent insulating substrate, the transparent insulating substrate must have heat resistance so as not to deform even at the annealing temperature. For this reason, quartz, which has a high heat resistance, is used as a material of the transparent insulating substrate. However, quartz is very expensive and a quartz substrate is diffucult to make in larger sizes. On the other hand, a glass substrate is inexpensive and is easy to make in larger sizes, but the glass substrate will deform at a deforming point temperature or higher, typically, at a temperature of 600° C. or higher. The "deforming point temperature" referred to herein means the highest temperature at which the glass substrate will not deform. Therefore, when a glass substrate is used, it is preferable to fabricate the semiconductor devices at a temperature of 600° C. or lower. At a temperature of 600° C., however, it takes about 20 hours to perform the annealing for activation after the ion implantation, which causes a problem in that the fabrication process is very time consuming.

It is known that when a transistor is fabricated using a thin polysilicon film as a channel layer, dangling bonds of silicon atoms which exist at grain boundaries in the channel region of the thin polysilicon film adversely affect the transistor characteristics. By terminating the dangling bonds with hydrogen, a source-to-drain current during the off state is decreased, a threshold voltage is lowered, and the ON/OFF ratio (comparing the source-to-drain current during an on state to the source-to-drain current during an off state) is improved. This results in the improvement in the transistor characteristics.

For example, a hydrogenation technique is disclosed in Japanese Laid-Open Patent Publication No. 63-119269. According to the disclosed technique, hydrogen ions of a dose of from $1 \times 10^{17}$ to $1 \times 10^{20}$ ions/cm$^2$ are accelerated at an accelaration voltage of 10 keV or lower, and are implanted into the channel region of the transistor. It is also disclosed that in order to effectively terminate the dangling bonds with hydrogen, it is necessary to perform annealing after the ion implantation. However, the hydrogen ions which have been implanted during hydrogenation leave from the polysilicon at about 400 C.

Therfore, when hydrogenation is to be performed after implanting impurities, the hydrogenation should be performed after the annealing at a relatively high temperature (about 600 C.) for activating the implanted impurities. Furthermore, in order to effectively terminate the dangling bonds with hydrogen, it is necessary to perform annealing at a relatively low temperature after implanting hydrogen ions. This means that it is necessary to perform both the ion implantation and the annealing twice.

Moreover, in the case where a CMOS transistor is to be fabricated, in order to form a p-region and an n-region, one of the two regions must be covered with a resist so that ions may not be implanted in that region when ions are implanted into the other region. As a result, the fabrication process becomes more complicated.

In an active matrix type liquid crystal display having thin film transistors in the pixel portion, the larger the display portion, the longer the corresponding gate bus line and source bus line. In order to prevent the resistance of the gate bus and source bus lines from increasing, a metal having a low resistance, e.g., containing aluminum or the like, is used as a material for fabricating the lines. It is preferable that a gate electrode is formed simultaneously with the gate bus line using the same metal, whereby the fabrication process of the thin film transistor is simplified. However, in order to attain good transistor characteristics, it is preferable to form source and drain regions in a self-aligned manner. For this purpose, it is necessary to perform ion implantation and activation annealing after forming the gate electrode.

If the gate electrode is formed of aluminum, however, the aluminum reacts with an insulating film or a semiconductor substrate in annealing after the ion implantation, because the melting point of aluminum is low. Therefore, the gate electrode cannot be formed of aluminum, and should be formed using a different material from that of the gate bus line, which results in a complicated fabrication process.

When thin film transistors are used for a liquid crystal display apparatus or an image sensor which has a large display area or a large sensing portion, the thin film transistors must drive large loads or drive loads at a high speed. Therefore, in such thin film transistors, semiconductor films for a channel region and source and drain regions of p-type or n-type conductivity preferably have a large field effect mobility. A semiconductor film of amorphous silicon can be formed at a temperature in the range of 200° to 300° C. by a plasma CVD (chemical vapor deposition) method, or at a temperature in the range of 400° to 500° C. by a low pressure CVD method. Such a low temperature process enables the use of cheap glass having a low deforming point temperature. In spite of such an advantage, the semiconductor film of amorphous silicon has a field effect mobility of only about 0.6 cm$^2$/V.s and is not suitable for driving a large load. On the other hand, a semiconductor film of polysilicon has a field effect mobility in the range of 30 to 150 cm$^2$/V.s and is suitable for driving a large load. However, the semiconductor film of polysilicon must be annealed at 500° C. or higher. Therefore, glass having a low deforming point temperature cannot be used as a substrate on which the semiconductor film of polysilicon is formed.

There has also been research in how to form a semiconductor layer of polysilicon by crystallizing amorphous silicon with heat treatment such as furnace annealing, laser annealing, lamp annealing, etc. However, these annealing methods have following shortcomings. A furnace annealing method requires a annealing time in the range of 4 to 24 hours at a temperature in the range of 550° to 600° C. to crystallize amorphous silicon. As a result, production efficiency is not good, and such annealing for a long time causes deformation of the glass substrate on which the amorphous silicon is formed. It is difficult to obtain a large area of polysilicon having uniform characteristics by a laser annealing method because the laser annealing method cannot anneal a large area of amorphous silicon in one time. A lamp annealing method uses light having a long wavelength to heat objects. Such light having a long wavelength transmits through a semiconductor layer and reaches to the glass substrate. This results in simply heating of the glass substrate and deformation of the glass substrate.

The present invention overcomes aforementioned shortcomings associated with conventional technique and provides a method for producing a polycrystalline semiconductor film which has a large area at a low temperature with high productivity, and a thin film transistor having good device characteristics.

SUMMARY OF THE INVENTION

According to the present invention, a method for producing a polycrystalline semiconductor film is provided. The method includes the steps of: forming a semiconductor film on a substrate; forming a passivation film on the semiconductor film; exciting a mixed gas including hydrogen and at least one element selected from the group consisting of the III, IV, and V groups of the periodic table to generating hydrogen ions and ions of the at least one element; and implanting the hydrogen ions into the semiconductor film through the passivation film and simultaneously implanting the ions of the at least one element into the semiconductor film through the passivation film, thereby changing the semiconductor film into a polycrystalline semiconductor film having the at least one element.

According to another aspect of the present invention, a method for producing a polycrystalline semiconductor film of n-type conductivity is provided. The method includes the steps of: forming a semiconductor film on a substrate; forming a passivation film on the semiconductor film; exciting a mixed gas including hydrogen and an element of the group V of the periodic table to form hydrogen ions and ions of the element; and implanting the hydrogen ions into the semiconductor film through the passivation film and simultaneously implanting the ions of the element into the semiconductor film through the passivation film in order to activate the ions of the element.

According to still another aspect of the present invention, a method for producing a polycrystalline semiconductor film of p-type conductivity is provided. The method includes the steps of: forming a semiconductor film on the substrate; forming a passivation film on the semiconductor film; exciting a mixed gas including hydrogen and an element of the group III of the periodic table to generating hydrogen ions and ions of the element; and implanting the hydrogen into the semiconductor film through the passivation film and simultaneously implanting the ions of the element into the semiconductor film through the passivation film in order to activate the ions of said element.

According to still another aspect of the present invention, a method for fabrication a thin film transistor is provided. The method includes the steps of: forming a polysilicon film on a insulating substrate; forming a passivation film on the polysilicon film; exciting a mixed gas including hydrogen and at least one element selected from the group consisting of the III, IV, and V groups of the periodic table to generating hydrogen ions and ions of the at least one element; and implanting the hydrogen ions into the semiconductor film through the passivation film and simultaneously implanting the ions of the at least one element into the semiconductor film through the passivation film in order to form at least one of a source and drain in the polysilicon film.

According to still another aspect of the present invention, a thin film transistor formed on an insulating substrate is provided. The thin film transistor includes: a polysilicon film formed on the insulating substrate; a gate insulating film formed on the polysilicon film; a gate electrode formed on the gate insulating film; and a source and a drain in the polysilicon film, the source and the drain being formed in a self-aligned manner by simultaneously implanting hydrogen ions and ions of an element selected from the group consisting of the III, IV and V groups of the periodic table into the polysilicon film using the gate electrode as a mask.

Thus, the invention described herein makes possible the following advantages:

(1) A step of annealing after ion implantation is not required. As a result, a glass substrate having a low deforming point temperature can be used as a transparent insulating substrate. Such a glass substrate is inexpensive and can be easily made to have a large area. Therefore, the cost of the fabricated product can be lowered, and the fabrication process can be simplified so as to shorten the fabrication time.

(2) After the ion implantation, only hydrogen ions are successively implanted into a channel region of a thin film transistor gate, so that the dangling bonds of silicon atoms which exist at grain boundaries of polysilicon are terminated with hydrogen. As a result, the characteristics of a thin film transistor can be improved, and the fabrication process can be simplified so as to shorten the fabrication time.

(3) The gate electrode of the thin film transistor can be made of aluminum or of a metal containing aluminum. As a result, the gate bus line can be simultaneously formed with the formation of the gate electrode, and the fabrication process can be simplified so as to shorten the fabrication time.

(4) A polycrystalline semiconductor film can be produced from amorphous semiconductor or microcrystalline semiconductor without annealing.

These and other advantages of the present invention will become apparent to those skilled in the art upon reading and understanding the following detailed description with reference to the accompanying figures.

DESCRIPTION OF THE PREFERRED EMBODIMENTS

Figure 1:
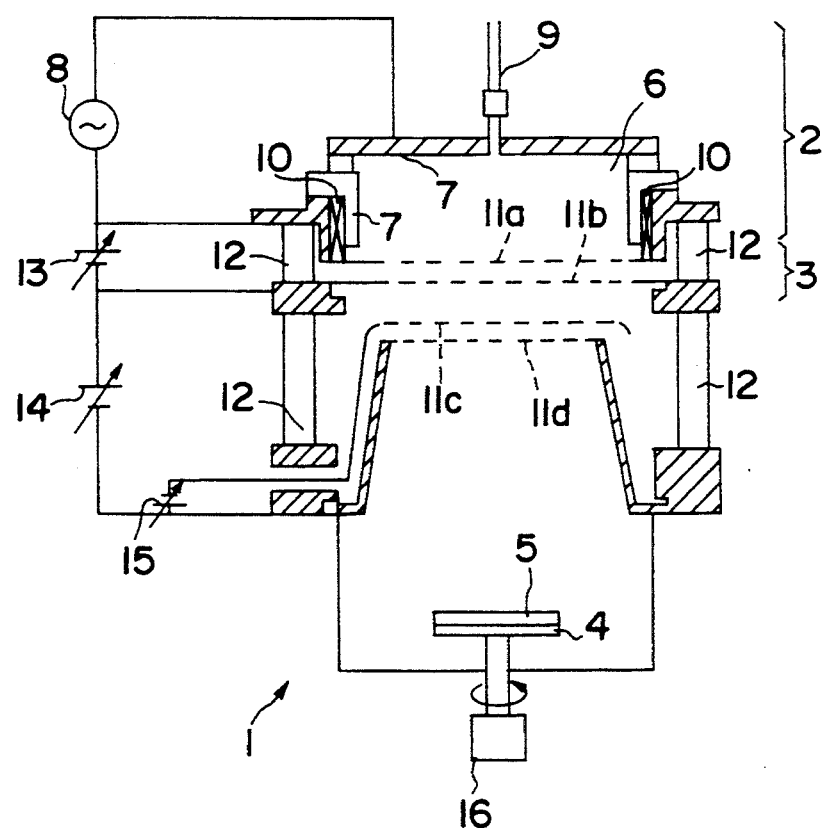
FIG. 1 is a sectional schematic view showing an ion implantation apparatus in accordance with the present invention.

FIG. 1 is a sectional schematic view of an ion implantation apparatus 1 used in accordance with the present invention. The ion implantation apparatus 1 shown in FIG. 1 includes a plasma source 2 for generating ions, an ion accelerator 3 for accelerating the generated ions, and a substrate holder 4 for holding a substrate 5.

The plasma source 2 includes a cylindrical chamber 6 for keeping a plasma, and high frequency electrodes 7 provided on a top and along the side of the cylindrical chamber 6. The high frequency electrode 7 on the top of the cylindrical chamber 6 has a diameter of about 60 cm, although the electrode 7 with a different diameter certainly is within the intended scope of the invention. A high frequency power supply 8 for exciting a plasma is connected to the high frequency electrodes 7. A gas inlet 9 for introducing a gas for forming the plasma as an ion source is provided in the center of the high frequency electrode 7 on the top of the cylindrical chamber 6. A magnet 10 is provided on the outside of the high frequency electrode 7 on the side of the cylindrical chamber 6 so as to aid effective generation of ions and to adjust the shape of the plasma. In the exemplary embodiment, a high frequency electric power of 13.56 MHz is applied to the high frequency electrodes 7 at 0 to 200 Watts (W) from the high frequency power supply 8. The pressure in the cylindrical chamber 6 is maintained in the range of 2 to $10 \times 10^{-4}$ Torr using known techniques. Thus, a plasma is generated and the introduced gas is partially ionized in the cylindrical chamber 6.

The ion accelerator 3 comprises electrode plates 11a, 11b, 11c and 11d disposed parallel to each other. These four electrode plates 11a, 11b, 11c and 11d respectively have mesh-type electrodes and terminals for applying voltage. The first electrode plate 11a is provided at the bottom of the cylindrical chamber 6. The four electrode plates 11a, 11b, 11c and 11d are insulated and are kept at appropriate intervals therebetween by an insulator 12. A first ion acceleration power supply 13 is connected between the first and the second electrode plates 11a and 11b. A voltage caused by the first ion acceleration power supply 13 derives the ions generated at the plasma source 2 into the ion accelerator 3. A second ion acceleration power supply 14 and a deceleration power supply 15 are connected between the second and the third electrode plates 11b and 11c. A voltage caused by the second ion acceleration power supply 14 further accelerates the derived ions. The ions are accelerated and proceed vertically downward (relative to FIG. 1) to the electrode plates 11a, 11b, 11c and 11d. A deceleration power supply 15 for controlling secondary electrons is also connected between the third and the fourth electrode plates 11c and 11d.

The substrate 5 is mounted on the substrate holder 4, and the substrate 5 is irradiated with the ions accelerated in the ion accelerator 3. The distance between the fourth electrode plate 11d and the substrate 5 is about 50 cm in the exemplary embodiment. The ion implantation apparatus 1 of the present invention is provided with a rotation mechanism 16 for rotating the substrate holder 4 so that the ions will be implanted into the substrate generally uniformly as will be appreciated.

Figure 2:
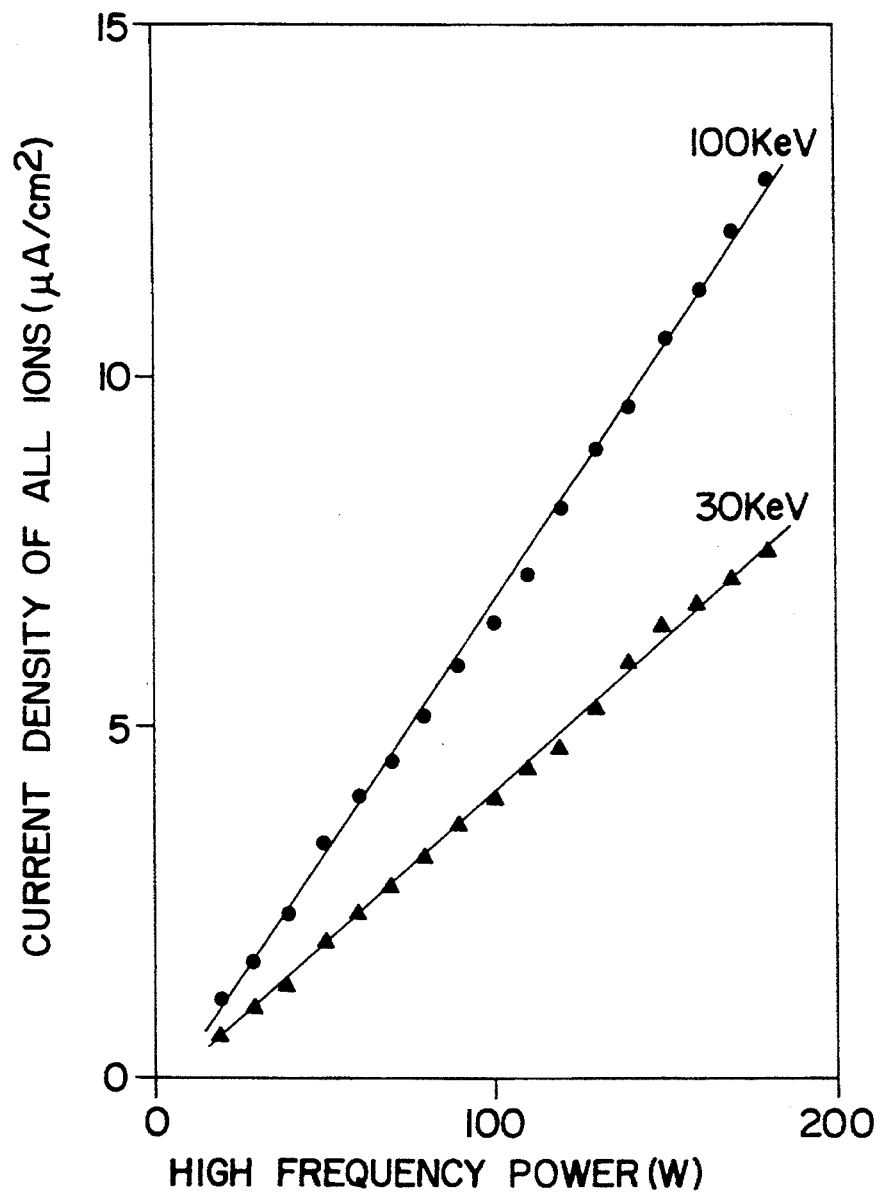
FIG. 2 shows a variation in the current density of all the kinds of ions which is obtained by varying a high frequency power applied to a plasma source of the ion implantation apparatus shown in FIG. 1, when the ion implantation apparatus is used for implanting ions in accordance with the invention.

Referring to FIG. 2, the manner in which the ion implantation apparatus 1 shown in FIG. 1 controls a dose of implanted ions is now described. As shown in FIG. 2, when a high frequency electric power of 13.56 MHz is applied to the high frequency electrodes 7 at 0 to 200 W from the high frequency power supply 8, and the acceleration voltage for the second ion acceleration power supply 14 is assumed to be 100 keV and 30 keV, respectively, the current density caused by the resultant kinds of ions implanted into the substrate holder 4 is in proportion to the high frequency power applied to the high frequency electrodes 7. If gases of $PH_3$ and $H_2$ are introduced via the gas inlet 9 as the ion source, a dose of implanted phosphorus ions is in proportion to the current density caused by all the kinds of implanted ions generated by the $PH_3$ and $H_2$ gases. Therefore, by appropriately adjusting the high frequency power, it is possible to control the dose of phosphorus ions to be implanted.

EXAMPLE 1

Figure 3:
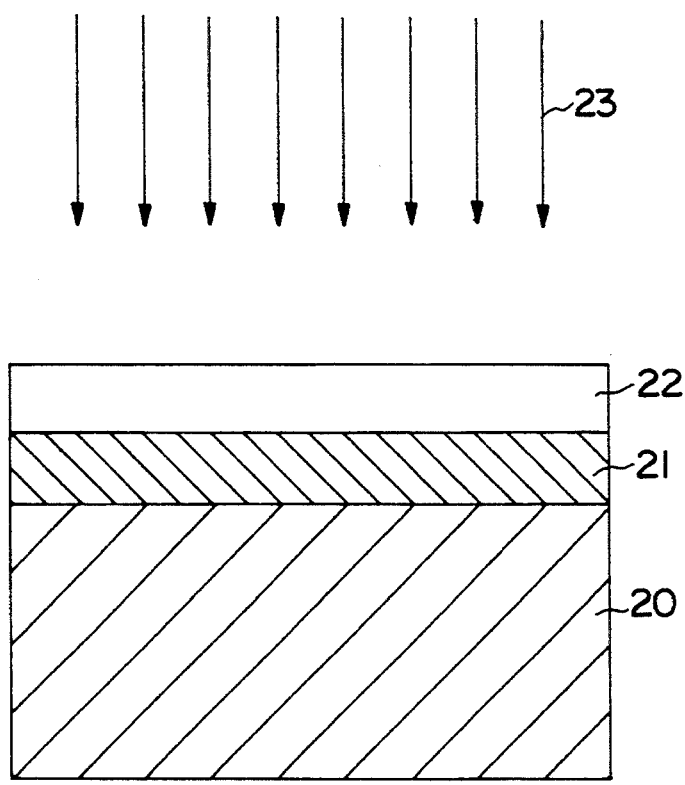
FIG. 3 is a schematic cross-sectional view illustrating a method of producing a polycrystalline semiconductor film according to the present invention.

Referring to FIGS. 1 and 3 to 6, a method for producing a semiconductor film having n-type conductivity is now explained. As is shown in FIG. 3, a semiconductor film 21 of polysilicon is formed on an insulating substrate 20 as a semiconductor film consisting of the elements classified as the group IV of the periodic table. A glass substrate having a low deforming temperature, for example, about 600° C., can be used for the insulating substrate 20. The semiconductor film 21 has a thickness of about 100 nm and is deposited at a temperature of 530° C. and at a pressure of 1 Torr using $SiH_4$ gas by an LPCVD (low pressure chemical vapor deposition) method. A silicon oxide film 22, as a passivation film, is formed on the semiconductor film 21 by an APCVD (atmospheric pressure chemical vapor deposition). Next, in the ion implantation apparatus 1 shown in FIG. 1, the insulating substrate 20 shown in FIG. 3 is mounted on the substrate holder 4, and ion implantation is performed. As is shown in FIG. 3, ions 23 containing n-type impurity ions and hydrogen ions are simultaneously implanted into the semiconductor film 21 through the silicon oxide film 22. The n-type impurity ions are selected from the elements classified as the group V of the periodic table.

Specifically, ion implantation is performed using a mixed gas of $PH_3$ and $H_2$ as a material gas introduced via gas inlet 9 to form a plasma in the cylindrical chamber 6, and the insulating substrate 20 is mounted on the substrate holder 4. Alternatively, a mixed gas of $AsH_3$ gas and $H_2$ gas may be used for generating ions 23 containing n-type impurity ions and hydrogen ions. The acceleration voltage for the second ion acceleration power supply 14 is assumed to be 100 keV and the current density caused by all the kinds of implanted ions generated by the $PH_3$ and $H_2$ gases is applied in the range of 1 to 10 $\mu A/cm^2$. A high frequency electric power of 13.56 MHz is applied to the high frequency electrodes 7 at 100 to 200 W from the high frequency power supply 8.

Figure 4:
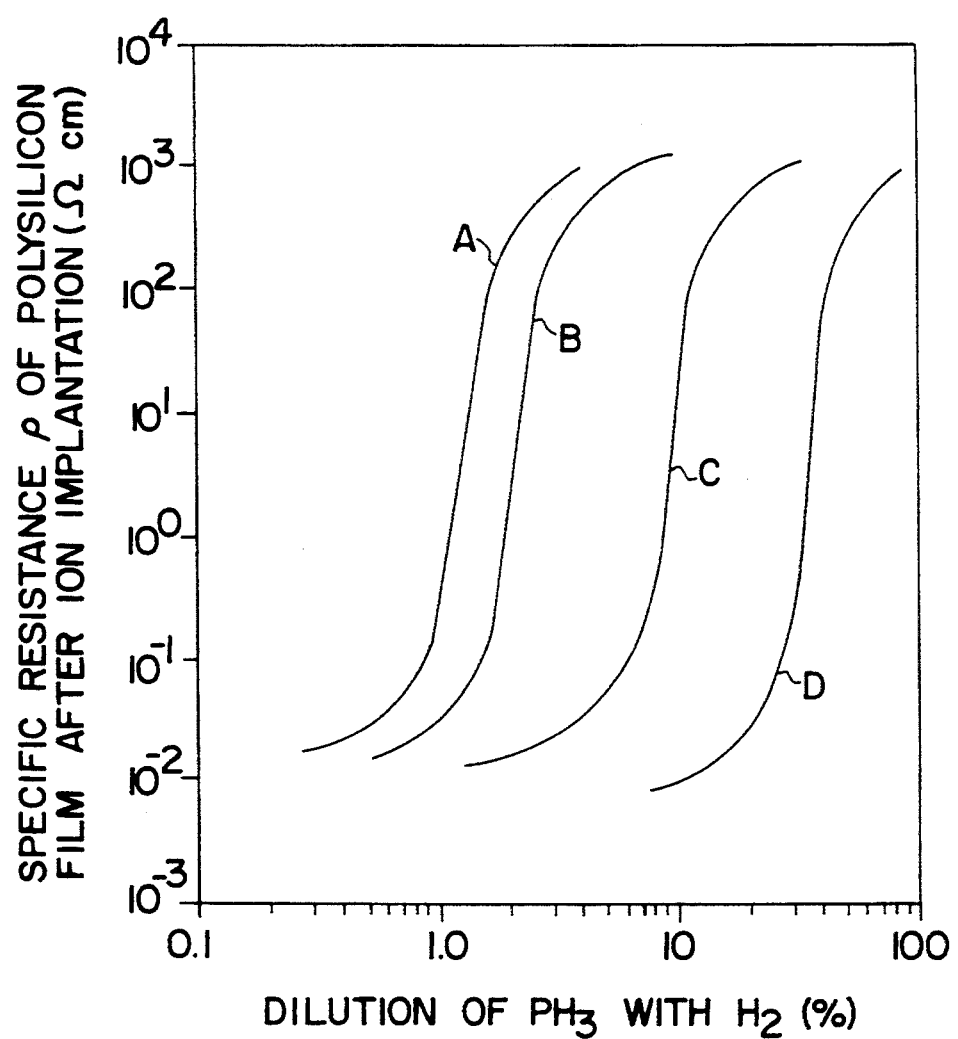
FIG. 4 is a graph showing the relationship between a specific resistance of a polysilicon film having n-type conductivity after implanting ions into the polysilicon film and a concentration of $PH_3$ contained in a material gas used in the ion implantation in accordance with the present invention.

FIG. 4 shows a variation in specific resistance of the semiconductor film 21 by varying the concentration ratio of $PH_3$ to $H_2$. In FIG. 4, the horizontal axis represents a dilution of $PH_3$ gas with hydrogen, and the vertical axis represents a specific resistance of the semiconductor film 21.

Curve A in FIG. 4 illustrates the result in the case where an ion dose of phosphorus is $5 \times 10^{14}$ ions/cm². As is seen from the curve A in FIG. 4, when the concentration of $PH_3$ gas is reduced to 2% or lower (i.e., when the concentration of $H_2$ gas is 98% or higher), the specific resistance greatly decreases. Especially when the concentration is 1% or lower, i.e., when the concentration of $H_2$ gas is 99% or higher, the value of the specific resistance indicates that it is not necessary to anneal the semiconductor film 21 for activation. That is, the silicon is perfectly in the polycrystalline state. In this example, it is possible to attain a uniform specific resistance of $\pm 8\%$ within the semiconductor film 21 with a size up to 30 cm $\times$ 30 cm. On the other hand, when the concentration of $PH_3$ gas is higher than 2%, i.e., when the concentration of $H_2$ gas is 99% or lower, the specific resistance is high, whereby it is necessary to anneal the semiconductor film 21 for activation.

Curve B in FIG. 4 illustrates the result in the case where an ion dose of phosphorus was $2\times10^{15}$ ions/cm$^2$. In this result, when the concentration of PH$_3$ gas is 1.5% or lower, i.e., when the concentration of H$_2$ gas is 98.5% or higher, the specific resistance is low and a polycrystalline silicon is obtained. Also, the same degree of uniformity in specific resistance within the substrate is attained as in the curve A, and a polysilicon film having a large area is obtained.

Curve C in FIG. 4 illustrates the result in the case where an ion dose of phosphorus is $1\times10^{16}$ ions/cm$^2$. In this result, when the concentration of PH$_3$ gas is 6% or lower, i.e., when the concentration of H$_2$ gas is 94% or higher, the specific resistance was low and a polycrystalline silicon is obtained. Also, the same degree of uniformity in specific resistance within the substrate is attained as in the curve A, and a polysilicon film having a large area is obtained.

Curve D in FIG. 4 illustrates the result in the case where an ion dose of phosphorus is $5\times10^{16}$ ions/cm$^2$. In this result, when the concentration of PH$_3$ gas is 20% or lower, i.e., when the concentration of H$_2$ gas is 80% or higher, the specific resistance is low and a polycrystalline silicon is obtained. Also, the same degree of uniformity in specific resistance within the substrate is attained as in the curve A, and a polysilicon film having a large area is obtained.

It is preferable that the semiconductor film 21 in a thin film transistor has a low specific resistance. Specifically, in a typical thin film transistor, which has a polysilicon film with a thickness of about 100 nm, for driving a liquid crystal display apparatus, it is preferable that the polysilicon film of the typical thin film transistor has the specific resistance of $1\times10^{-1}$ $\Omega\cdot$cm or lower for practical use. In the typical thin film transistor, the specific resistance of $1\times10^{-1}$ $\Omega\cdot$cm causes a driving voltage of 10 V to decrease by 10% between a source and a drain, which is marginal to operate the typical thin film transistor.

In the case where an ion dose of phosphorus was lower than $5\times10^{14}$ ions/cm$^2$, the specific resistance of the semiconductor film 21 was higher than $1\times10^{-1}$ $\Omega\cdot$cm at any concentration of PH$_3$ gas. Therefore, it is very difficult to produce a thin film transistor for practical use in the case where an ion dose of phosphorus was lower than $5\times10^{14}$ ions/cm$^2$. On the other hand, in the case where an ion dose of phosphorus was higher than $5\times10^{16}$ ions/cm$^2$, only 1% of implanted phosphorus ions into the semiconductor film 21 was activated after implantation. This means that it is not practical to implant ions into the semiconductor film 21 with a higher concentration than $5\times10^{16}$ ions/cm$^2$ in view of productivity.

Figure 5:
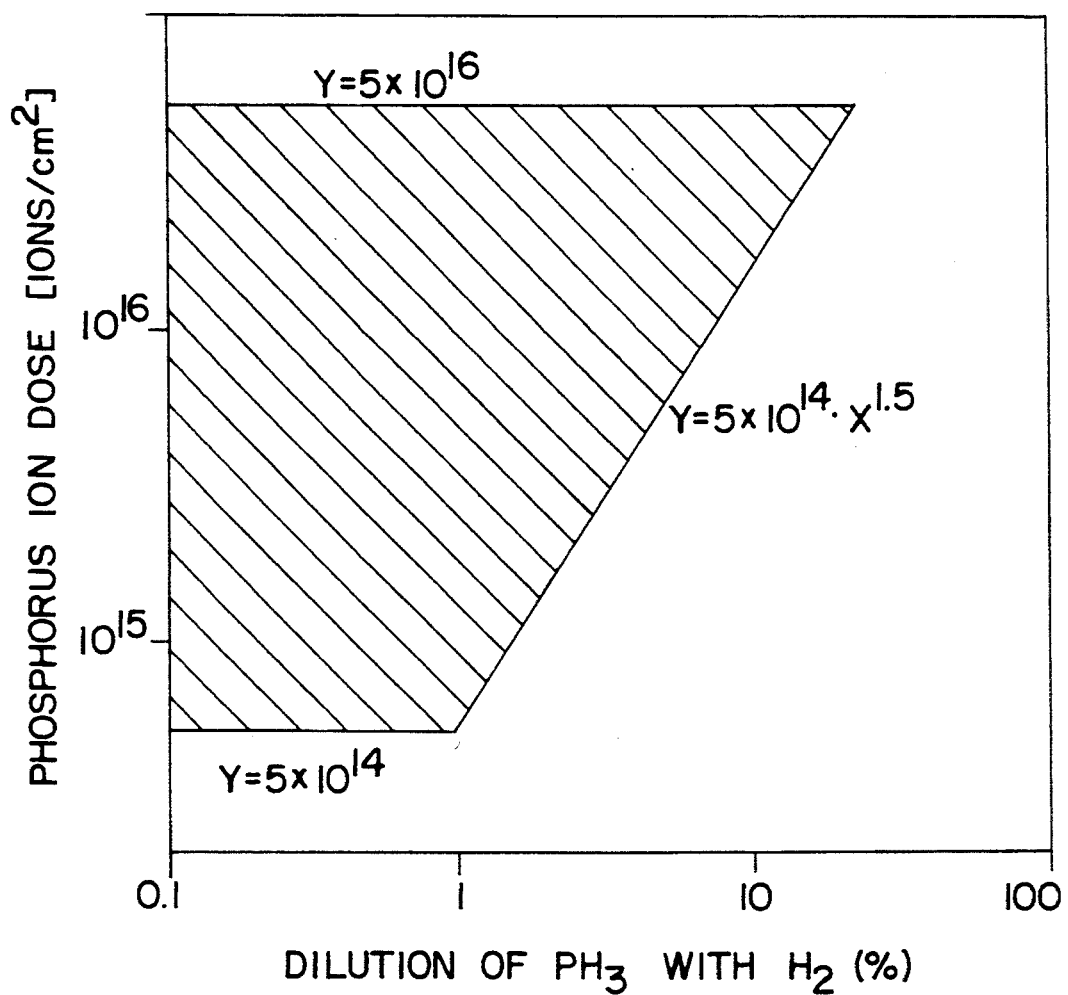
FIG. 5 is a graph showing the preferable relationship between a specific resistance of a polysilicon film after implanting ions into the polysilicon film and a phosphorus ion dose to obtain the polysilicon film having a low specific resistance.

Because of the aforementioned reasons, it is understood that the phosphorus ion dose and the concentration of PH$_3$ gas are preferably in the range shown as the hatched area in FIG. 5. Specifically, the phosphorus ion dose and the concentration of PH$_3$ gas preferably satisfy following inequalities (1) and (2):

$$Y \geq 5\times10^{14}\cdot X^{1.5} \quad (1)$$

$$5\times10^{14} \leq Y \leq 5\times10^{16} \quad (2)$$

where X is the concentration of PH$_3$ represented by percentage and Y is the ion dose of phosphorus. The inequality (1) defines a marginal condition of the phosphorus ion dose and the concentration of PH$_3$ gas to obtain a semiconductor film 21 having a specific resistance of $1\times10^{-1}$ $\Omega\cdot$cm or lower. Moreover, in order to improve the activation efficiency without annealing in view of the productivity, it is preferable to set the current density caused by all the kinds of ions generated by the PH$_3$ gas and the H$_2$ gas to be about 1 $\mu$A/cm$^2$.

Figure 6:
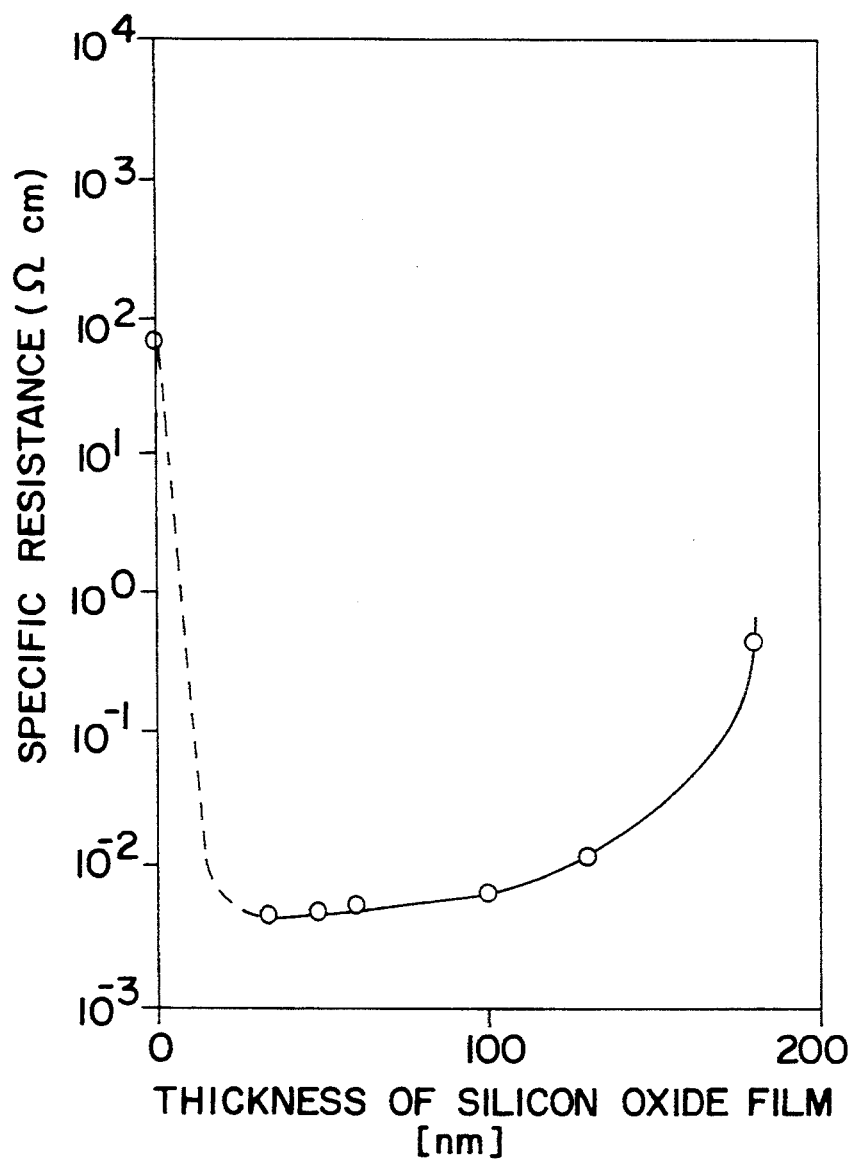
FIG. 6 is a graph showing the relationship between a specific resistance of a polysilicon film after implanting ions into the polysilicon film and a thickness of a silicon oxide film formed on the polysilicon film in accordance with the present invention.

In addition to the above-mentioned condition, it is preferable that the silicon oxide film 22 shown in FIG. 3 has a thickness in the range of 10 to 170 nm. FIG. 6 shows a variation in specific resistance of the semiconductor film 21 by varying the thickness of the silicon oxide film 22. In FIG. 5, the horizontal axis represents a thickness of the silicon oxide film 22, and the vertical axis represents a specific resistance of the semiconductor film 21. Implantation was performed at an acceleration voltage of 100 keV and at a phosphorus ion dose of $2\times10^{16}$ ions/cm$^2$. As is shown in FIG. 6, a polysilicon film having a low specific resistance is not obtained without the silicon oxide film 22 (i.e., a thickness is 0 nm). In the case where the thickness of the silicon oxide film 22 is more than 100 nm, a specific resistance is gradually increasing. When the thickness of the silicon oxide film 22 is more than 170 nm, the specific resistance is above $1\times10^{-1}$ $\Omega\cdot$cm. Therefore, in order to produce a semiconductor film having a specific resistance of $10^{-1}$ $\Omega\cdot$cm or lower, the silicon oxide film 22 preferably has a thickness in the range of 10 to 170 nm.

It is understood that an insulating film of other material than silicon oxide may be used for a passivation film. For example, a passivation film of silicon nitride, or the like may be used. As the silicon oxide used in this Example 1 has a density in the range of 2.0 to 2.6 g/cm$^3$, in the case where the passivation film of other material having a density in the range of 2.0 to 2.6 g/cm$^3$ is formed on the semiconductor film 21, it is preferable that the passivation film has a thickness in the range of 10 to 170 nm, as is explained above. For example, a passivation film of silicon nitride, which is formed at a temperature in the range of 200° to 400° C. by a plasma CVD method, has a density of about 2.6 g/cm$^3$. Therefore, such a passivation film of silicon nitride may be formed on the semiconductor film 21 instead of the silicon oxide film 22.

EXAMPLE 2

Figure 7:
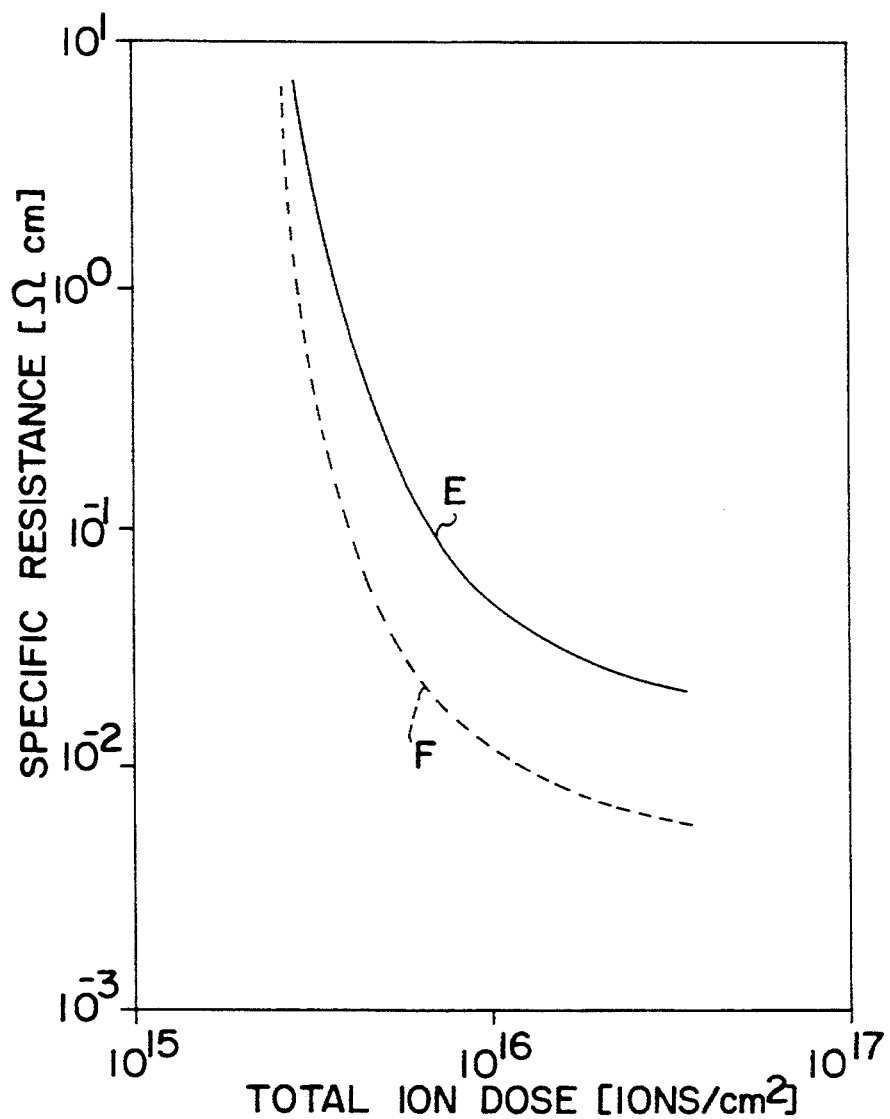
FIG. 7 is a graph showing the relationship between a specific resistance of a polysilicon film having p-type conductivity after implanting ions into the polysilicon film and a total ion dose in accordance with the present invention.

Referring to FIGS. 2, 3, and 7, a method for producing a p-type semiconductor film is now explained. As is shown in FIG. 3, a semiconductor film 21 of polysilicon is formed on the insulating substrate 20 as a semiconductor film consisting of the elements classified as the group IV of the periodic table, and a silicon oxide film 22 as a passivation film is then formed on the semiconductor film 21 by the same method as is explained in the Example 1. As is explained in Example 1, it is preferable that the silicon oxide film 22 has a thickness in the range of 10 to 170 nm. Also, a passivation film of other material than silicon oxide may be used. After mounting the insulating substrate 20 on the substrate holder 4 in the ion implantation apparatus 1 shown in FIG. 1, ions 23 containing impurity ions and hydrogen ions are simultaneously implanted into the semiconductor film 21 through the silicon oxide film 22. Specifically, B$_2$H$_6$ gas diluted to 5% with H$_2$ gas is used so as to generate ions as a plasma source. The B$_2$H$_6$ gas generates boron ions which are p-type impurities of the group III of the periodic table. Ion implantation is performed in the same way as is explained in Example 1 except for the following condition. The high frequency power supply 8 supplies a power in the range of 100 to 200 W, preferably a power of 100 W, to the high frequency electrodes 7, and the pressure in the cylindrical chamber 6 is in the range of $2\times10^{-4}$ to $2\times10^{-3}$ Torr, preferably $1\times10^{-3}$ Torr. The current density caused by all kinds of implanted ions generated by the $B_2H_6$ gas, the $SiH_4$ gas, and the $H_2$ gas is applied in the range of 1 to 10 $\mu A/cm^2$, preferably 5 $\mu A/cm^2$, and the acceleration voltage is in the range of 60 keV to 110 keV, preferably 80 keV.

FIG. 7 shows a variation in specific resistance of the polysilicon film by varying the total ion dose. In FIG. 7, the horizontal axis represents a total ion dose implanted into the semiconductor film 21, and the vertical axis represents a specific resistance of the semiconductor film 21. Curve E shown in a solid line illustrates the result in the case where the $B_2H_6$ gas diluted to 5% with the $H_2$ gas is used. Curve F shown in a dotted line illustrates the result in the case where the $PH_3$ gas diluted to 5% with the $H_2$ gas. The curve F is shown in FIG. 7 so as to compare the result of n-type semiconductor film 21 of the present invention.

The curve E illustrates that the specific resistance of the semiconductor film 21 reduces as the total ion dose increases. Specifically, when the $B_2H_6$ gas diluted with the $H_2$ gas is implanted into the semiconductor film 21 by a dose of $6\times10^{15}$ ions/$cm^2$ or more, the specific resistance decreases to $1\times10^{-1}$ $\Omega\cdot cm$ or lower. Compared with the curve F which illustrates the result of n-type semiconductor film 21 at the same total ion dose, the curve E shows a higher specific resistance in a some degree. However, it is enough practical to obtain a p-type semiconductor film having a low specific resistance without annealing according to the present invention.

EXAMPLE 3

Figure 8:
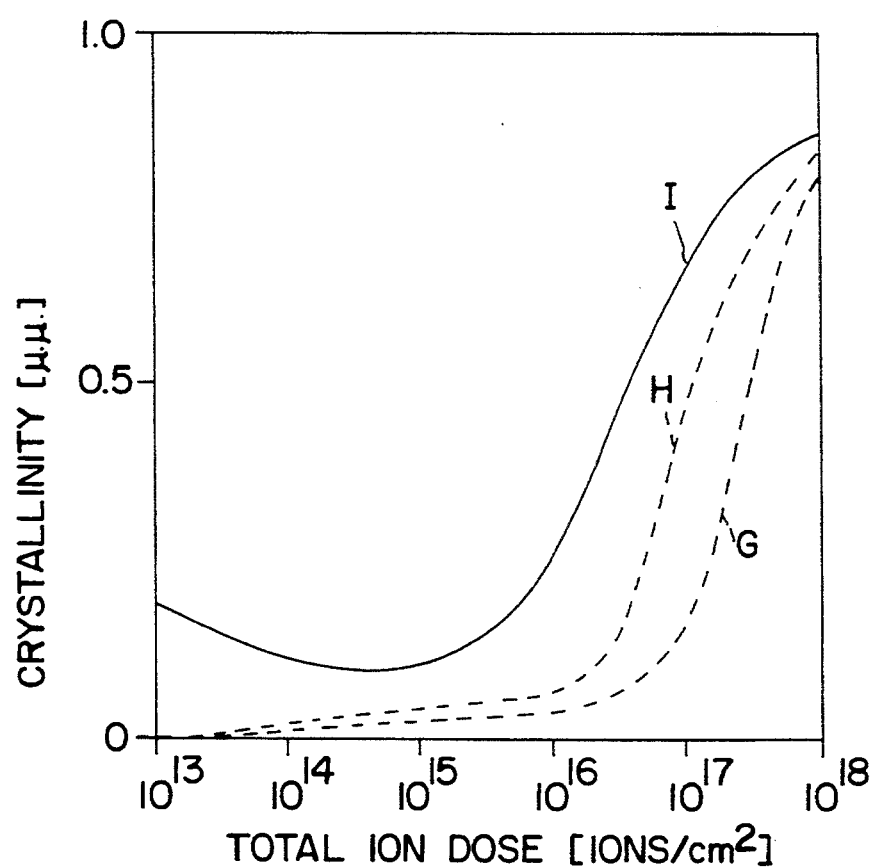
FIG. 8 is a graph showing the relationship between a crystallinity of a silicon film after implanting ions into a microcrystalline silicon film and an amorphous silicon film, and a total ion dose in accordance with the present invention.

Referring to FIGS. 1, 3, and 8, a method for producing a polycrystalline semiconductor film is now explained. As is shown in FIG. 3, a semiconductor film 21 is formed on the insulating substrate 20, and a silicon oxide film 22 as a passivation film is then formed on a semiconductor film 21 by the same method as is explained in Example 1. As is explained in Example 1, it is preferable that the silicon oxide film 22 has a thickness in the range of 10 to 170 nm. Also, a passivation film of other material than silicon oxide may be used. An amorphous silicon film or a microcrystalline silicon film is used as the semiconductor film 21 of the group IV of the periodic table. In this specification, microcrystalline silicon is defines as the silicon having a grain size of 50 nm or less and a crystallinity in the range of 0.05 to 0.6. For example, such a microcrystalline silicon film can be formed by a plasma CVD method using a mixed gas of $SiH_4$ gas and $H_2$ gas in the proportion of 1:30 to 1:100. A substrate temperature is in the range of 150° to 400° C., preferably at 300° C., and an RF power of 400 W is applied. The microcrystalline semiconductor film formed under this condition has a thickness of about 100 nm and a crystallinity of 0.20. The amorphous silicon film is formed by an LPCVD using a disilane ($Si_2H_6$) at a temperature of 450° C. The amorphous silicon film has a thickness of 100 nm and a crystallinity of 0.05 or less. Such an amorphous silicon can be also formed by using silane gas at 570° C. or by a mixed gas of $SiH_4$ and $H_2$ in the proportion of 2:3 at 250° C. and an RF power of 50 W.

After mounting the insulating substrate 20 on the substrate holder 4 in the ion implantation apparatus 1 shown in FIG. 1, ions 23 containing ions of the group IV of the periodic table and hydrogen ions are simultaneously implanted into the semiconductor film 21 through the silicon oxide film 22. Specifically, $SiH_4$ gas diluted to 5% with $H_2$ gas is used so as to generate ions as a plasma source. Ion implantation is performed in the same way as is explained in Example 1 except for the following condition. The high frequency power supply 8 supplies about 200 W to the high frequency electrodes 7. A current density caused by all kinds of implanted ions generated by the $SiH_4$ gas and the $H_2$ gas is applied at 10 $\mu A/cm^2$. The acceleration voltage is 100 keV.

FIG. 8 shows a variation in crystallinity of the polysilicon film by varying the total ion dose. In FIG. 8, the horizontal axis represents a total ion dose implanted into the semiconductor film 21, and the vertical axis represents a crystallinity of the semiconductor film 21. When ultraviolet rays generated by a deutelium lamp proceed to a semiconductor film at an incident angle of 5° and intensity of reflected rays is measured, a peak of a wavelength of 280 nm is observed. The peak derives from absorption of the $E_2$ band (4.31 eV) in crystalline silicon, and amorphous silicon does not cause the peak. Therefore, by measuring the intensity of the peak, the crystallinity of the silicon film can be measured.

Curve G shown in a dotted line illustrates the result in the case where the semiconductor film 21 is made from an amorphous silicon by implantation at room temperature. Curve H shown in a dotted line illustrates the result in the case where the semiconductor film 21 is made from an amorphous silicon by implantation at a temperature of 350° C. Curve I shown in a solid line illustrate the result in the case where the polysilicon film 21 is made from a microcrystalline silicon.

As is illustrated by the curves G and H, the crystallinity of the amorphous silicon increases with increasing total ion dose. This means that a polysilicon is formed by simultaneously implanting silicon ions and hydrogen ions into the amorphous silicon film without annealing. Especially, by implanting silicon ions and hydrogen ions at a substrate temperature of 350° C., the polysilicon film can be produced with less ion dose compared to that by implanting silicon ions and hydrogen ions at room temperature. For example, in order to obtain polysilicon film having a crystallinity of 0.5, implantation at a room temperature requires a dose of $3.2\times10^{17}$ ions/$cm^2$, while implantation at 350° C. requires a dose of $1\times10^{17}$ ions/$cm^2$. In this case, implanting ions with a dose of $3.2\times10^{17}$ ions/$cm^2$ takes about 85 minutes.

As is indicated by the curve I, in the case where silicon ions and hydrogen ions are simultaneously implanted into a microcrystalline silicon film under the above-mentioned condition, a polysilicon having a crystallinity of 0.5 can be obtained. In this case, a total ion dose is $3.2\times10^{16}$ ions/$cm^2$ and implantation time is about 8 minutes 30 seconds.

As is explained above, by simultaneously implanting silicon ions and hydrogen ions into an amorphous silicon film, a polysilicon film having a high crystallinity is obtained. Annealing after the ion implantation is not required. The amorphous silicon film can be formed at comparatively low temperature, particularly below 450° C., which enables the use of a cheap glass substrate having a low deformation temperature. A polysilicon film having a high crystallinity is also obtained by simultaneously implanting phosphorus ions and hydrogen ions into a microcrystalline silicon film. During implantation, microcrystals in the microcrystalline silicon film functions as needs, and crystallization of the microcrystalline silicon film is promoted by the microcrystals. Annealing after the ion implantation is not required. Therefore, a polysilicon film can be formed with less dose than that required for implantation of an amorphous silicon film.

The present invention is also applied to a polysilicon film. For example, when silicon ions and hydrogen ions are simultaneously implanted into a polysilicon film having a grain size of 2 to 3 μm under the condition mentioned above, the polysilicon film having a grain size of 7 to 8 μm is obtained. The obtained polysilicon film has grains which are oriented to (111) direction because the grains grow in the (111) direction. Such a polysilicon film oriented to the (111) direction has a high field effect mobility and is suitable for use of a TFT transistor to improve device characteristics.

EXAMPLE 4

Figure 9A:
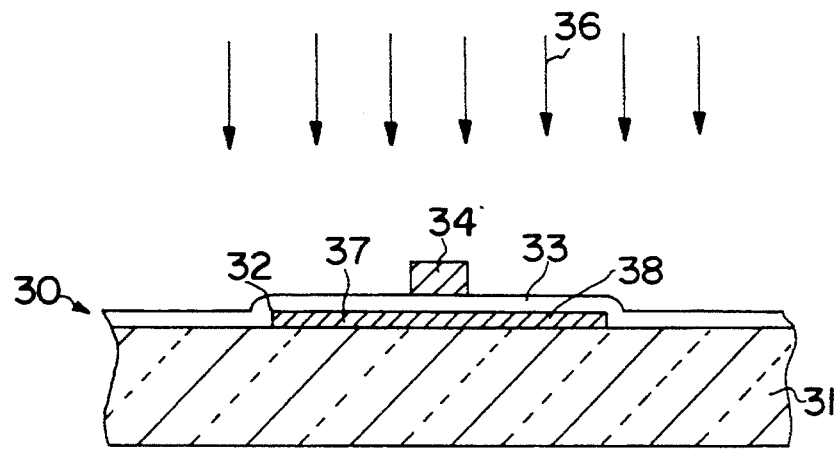
FIGS. 9A and 9B are sectional views showing a thin film transistor according to an example of the present invention.
Figure 9B:
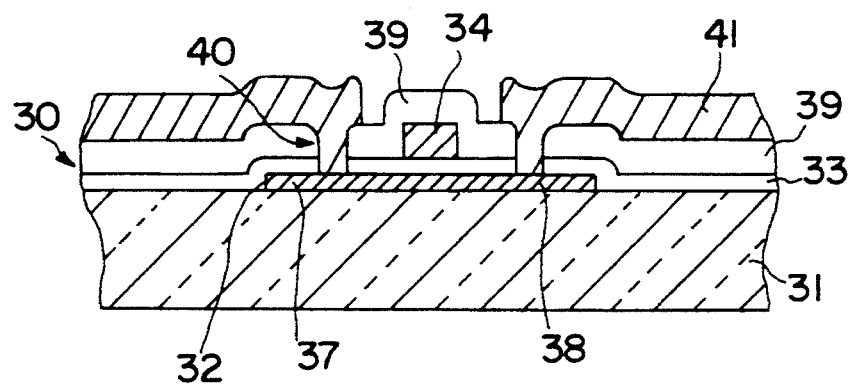
Figure 10:
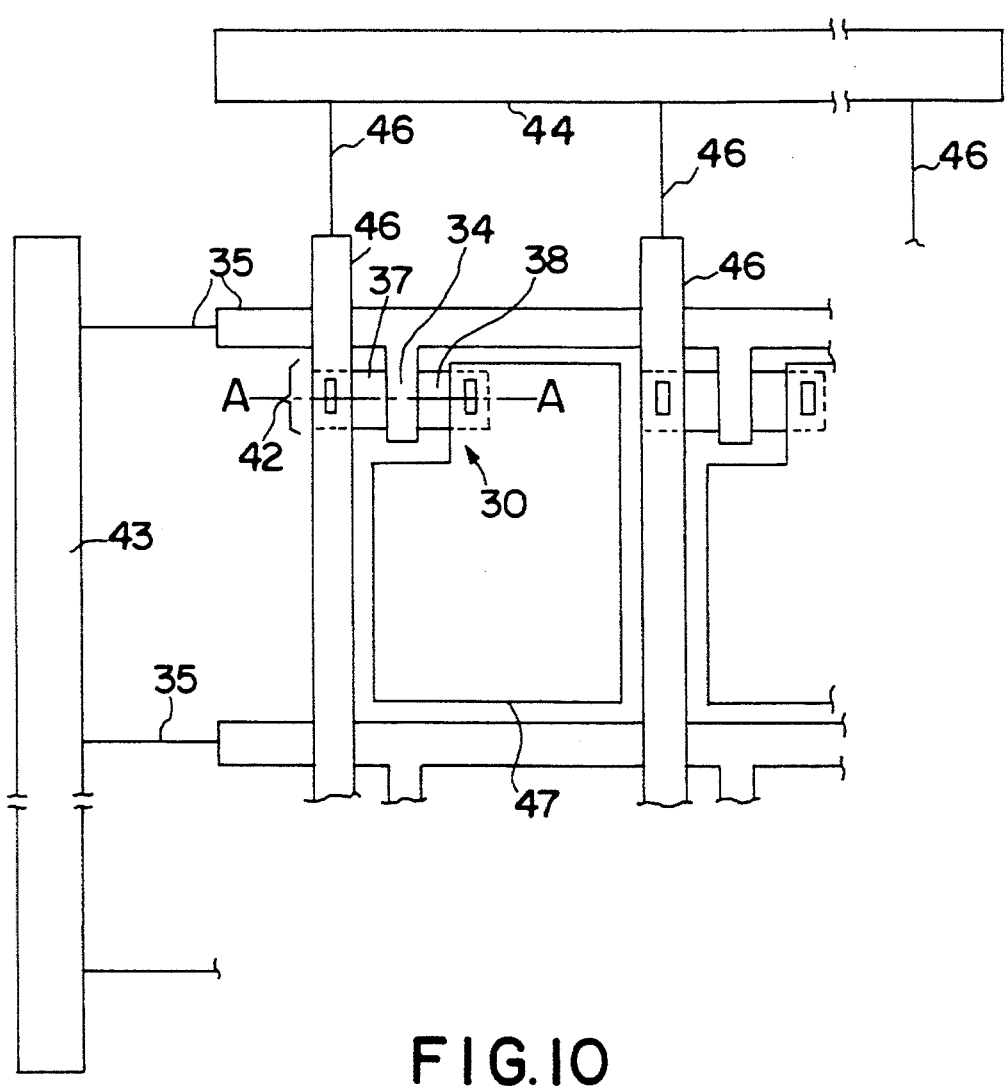
FIG. 10 is a plan view showing a liquid crystal display apparatus using a thin film transistor according to an example of the present invention.

Referring to FIGS. 9A, 9B and 10, a method of fabricating a thin film transistor 30 according to the present invention is described. FIGS. 9A and 9B show sectional views taken along the line A—A in FIG. 10 at the completion of different steps as will be further described herein.

As a transparent insulating substrate 31 for supporting the thin film transistor 30, a quartz substrate or a glass substrate which has a deforming point temperature of 450° C. or higher, and preferably in the range of 450° C. to 600° C. can be used. As is shown in FIG. 9A, a semiconductor film 32 having a thickness of 50 to 150 nm is formed and patterned on the transparent insulating substrate 31. The semiconductor film 32 is made of polysilicon, microcrystalline silicon, or amorphous silicon. Then, a silicon oxide film 33 having a thickness of about 100 nm is deposited as a gate insulating film.

In the case where the semiconductor film 32 of microcrystalline silicon or amorphous silicon is used, microcrystalline silicon or amorphous silicon must be changed into polysilicon. As is explained in Example 3, in the ion implantation apparatus 1 shown in FIG. 1, the transparent insulating substrate 31 shown in FIG. 9A is mounted on the substrate holder 4, and ion implantation is performed. SiH$_4$ gas diluted to 5% with H$_2$ gas is introduced into the cylindrical chamber 6 via the gas inlet 9, and ions are generated by applying an RF power of 200 W to the high frequency electrodes 7. The generated ions are accelerated by an acceleration voltage of 100 keV for amorphous silicon and 80 keV for microcrystalline silicon. In the case where amorphous silicon is changed to the polysilicon, ion implantation is performed at a current density of 10 μA/cm$^2$ for 80 minutes while the substrate holder 4 is heated at 350° C. This results in a dose of $3 \times 10^{17}$ ions/cm$^2$. In the case where microcrystalline silicon is changed into the polysilicon, ion implantation is performed at a current density of 10 μA/cm$^2$ for 13 minutes while the substrate holder 4 is kept at room temperature. This results in a dose of $5 \times 10^{16}$ ions/cm$^2$.

Then, a gate electrode 34 having a thickness of about 200 to 300 nm and a gate bus line 35 having a thickness of about 200 to 300 nm as shown in FIG. 10 are simultaneously formed. The gate electrode 34 and the gate bus line 35 can be formed using a single-layer metal film of Al or AlSi or a two-layer metal film of Ti/Al or Ti/AlSi, for example. In order to lower the resistance of the gate bus line, it is especially preferable to use a metal containing Al.

Next, in the ion implantation apparatus 1 shown in FIG. 1, the transparent insulating substrate 31 shown in FIG. 9A is mounted on the substrate holder 4, and ion implantation is performed according to Example 1 or Example 2 based on the desired conductivity type. As is shown in FIG. 9A, ions 36 containing impurity ions and hydrogen ions are simultaneously implanted into the substrate 31. Because the gate electrode 34 serves as an implantation mask, a source 37 and a drain 38 are formed in the semiconductor film 32 in a self-aligned manner. The source 37 and drain 38 are also shown in FIG. 10. In this step, the annealing for activating impurity ions is not performed.

Then, as is shown in FIG. 9B, a silicon oxide film 39 having a thickness of about 500 nm is formed as an interlevel insulating film by atmospheric-pressure chemical vapor deposition with the substrate temperature at 430° C. Contact holes 40 are then formed through the silicon oxide film 39 for connecting the source 37 and drain 38 with a lead electrode 41. Then, the lead electrode 41 is formed by sputtering at a room temperature. As a result of the above process steps, transistor portions 42 and gate bus lines 35 are formed. In this example, all the process steps after the ion implantation are performed at a temperature of 450° C. or lower.

The active matrix type liquid crystal display apparatus shown in representative part in FIG. 10 includes, in addition to the transistor portions 42 and the gate bus lines 35, a gate drive circuit 43, a source drive circuit 44, source bus lines 46 and pixel portions 47. The gate drive circuit 43 selects one of the plural gate bus lines 35, and a signal voltage is applied from the source drive circuit 44 to a liquid crystal capacitance via the source bus lines 46, so as to perform a liquid crystal display.

EXAMPLE 5

As is explained in Example 4, a method of producing a thin film transistor of the present invention does not require an annealing step after ion implantation step. Therefore, immediately after implanting n-type or p-type impurities into the semiconductor film 32 according to the present invention, implantation for hydrogenation can be successively performed.

Specifically, after the step of the ion implantation for forming the source 37 and the drain 38, only hydrogen ions are implanted into a portion of semiconductor film 32 under the gate electrode 34. This implantation of hydrogen ions is successively performed after the ion implantation of ions 36 without taking the substrate 31 out of the ion implantation apparatus 1 shown in FIG. 1. The implantation is performed at an energy level of 20 to 30 keV, and the dose is $2 \times 10^{15}$ to $2 \times 10^{16}$ ions/cm$^2$. It is sufficient that the implantation energy is set to be at a level at which hydrogen ions can penetrate the silicon oxide film 33 and the gate electrode 34. Before the implantation of hydrogen ions, the substrate temperature is measured to be a room temperature. During the ion implantation, the temperature at the surface of the substrate 31 may rise up to 300° C. depending on the ion current density. Such a difference in substrate temperature has been found not to cause a significant difference in the effect of the hydrogenation.

Figure 11:
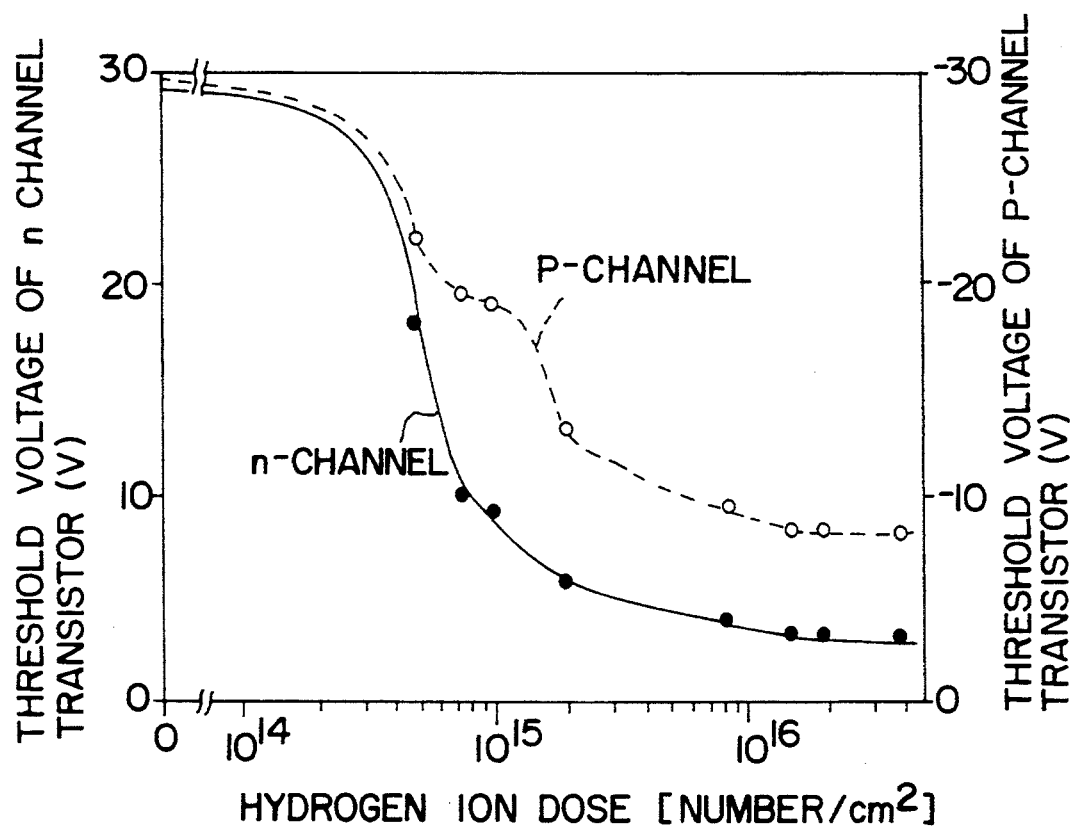
FIG. 11 is a graph showing the relationship between a threshold voltage of a transistor and a dose of implanted hydrogen ions, when the hydrogen ions are implanted under conditions explained in Example 5 in accordance with the invention.

FIG. 11 shows the dependency of the threshold voltages of n-channel and p-channel transistors (L/W=7 μm/5 μm; wherein channel length, and W denotes a channel width) on a dose of implanted hydrogen ions for hydrogenation. If the hydrogenation is performed after implanting impurity ions, the threshold voltages are reduced. When the implant dose is $2\times 10^{15}$ ions/cm$^2$ or larger, the characteristics are significantly improved. When the implant dose is $2\times 10^{16}$ ions/cm$^2$ or larger, a saturation tendency is exhibited. If hydrogen ions of a dose in a range of $2\times 10^{15}$ to $2\times 10^{16}$ ions/cm$^2$ are implanted, a source-drain current during an OFF state of the transistor is reduced to several picoamperes. Accordingly, the ratio of a current during the ON state of the transistor to a current during the OFF state of the transistor is improved to be $10^6$ or higher.

As is explained in Examples 1 to 5, according to the present invention, hydrogen ions and impurity ions are simultaneously implanted into a semiconductor layer. As a result, it is possible to attain a high carrier mobility without annealing after the ion implantation. When impurities and a large amount of hydrogen were simultaneously implanted, polysilicon is amorphous directly after the start of the implantation. The polysilicon gradually turns to polycrystalline and the specific resistance is lowered. During the implantation, the substrate temperature rises up to 300° C. However, at a temperature of such a degree, the impurities implanted by the conventional implantation technique cannot be activated. Therefore, it is seen that the increase in substrate temperature during the ion implantation does not eliminate the need for the annealing step for activating the implanted impurities.

Moreover, according to the present invention, polycrystalline semiconductor film can be obtained from an semiconductor film of an amorphous state or a microcrystalline state. By simultaneously implanting hydrogen ions and ions of the same element as that of the semiconductor film, the polycrystalline semiconductor film is formed without annealing. Therefore, a polycrystalline semiconductor film can be formed on a glass substrate having a low deforming point temperature, which enables production of thin film transistor having good device characteristics on an inexpensive glass substrate.

The hydrogen ions and impurity ions are simultaneously implanted into a polysilicon film by an ion shower doping method, so that a thin film transistor is fabricated at a temperature of 450° C. or lower after the ion implantation. This means that the thin film transistor can easily be fabricated on a glass substrate which has a low deforming point. Since this fabrication process does not necessitate an annealing step after the ion implantation, the following effects can be attained.

First, the fabrication process can be simplified and the fabrication time can be shortened even by a process at 450° C. or lower.

Additionally, the characteristics of a thin film transistor can be improved by implanting only hydrogen ions of a dose in the range of $2\times 10^{15}$ to $2\times 10^{16}$ ions/cm$^2$ into a channel of the thin film transistor successively after the ion implantation and by terminating dangling bonds of silicon atoms which exist at grain boundaries of polysilicon with hydrogen. Moreover, by setting the dose of implanted hydrogen ions in the above range, the implant energy of hydrogen is relatively small, whereby the possibility of damage to the ion implantation apparatus can be reduced.

Furthermore, as a material of a gate electrode of the thin film transistor, aluminum or a metal containing aluminum can be used. Therefore, gate bus lines can be simultaneously formed with the formation of the gate electrode, so that the fabrication process is simplified and the fabrication time can be shortened.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a polycrystalline semiconductor film, comprising the steps of:

forming a semiconductor film on a substrate;

forming a passivation film on said semiconductor film;

exciting a mixed gas including hydrogen and at least one element selected from the group consisting of the III, IV, and V groups of the periodic table to generate hydrogen ions and ions of said at least one element; and implanting said hydrogen ions into said semiconductor film through said passivation film and simultaneously implanting said ions of said at least one element into said semiconductor film through said passivation film, thereby changing said semiconductor film into a polycrystalline semiconductor film having said at least one element.

2. A method according to claim 1, wherein said semiconductor film includes amorphous silicon.

3. A method according to claim 1, wherein said semiconductor film includes microcrystalline silicon.

4. A method according to claim 1, wherein said semiconductor film includes polysilicon.

5. A method according to claim 1, wherein said polycrystalline semiconductor film is fabricated without any annealing steps at a temperature of 450° C. or higher after said ion implantation step.

6. A method for producing a polycrystalline semiconductor film of n-type conductivity, comprising the steps of:

forming a semiconductor film on a substrate;

forming a passivation film on said semiconductor film;

exciting a mixed gas including hydrogen and an element of the group V of the periodic table to form hydrogen ions and ions of said element; and implanting said hydrogen ions into said semiconductor film through said passivation film and simultaneously implanting said ions of said element into said semiconductor film through said passivation film in order to activate said ions of said element.

7. A method according to claim 6, wherein said mixed gas includes H$_2$ gas and PH$_3$ gas.

8. A method according to claim 7, wherein said mixed gas and an ion dose of phosphorus satisfy the following inequalities:

$$Y \geqq 5\times 10^{14}\cdot X^{1.5}$$

$$5\times 10^{14} \leqq Y \leqq 5\times 10^{16}$$

where X is the concentration of PH$_3$ in said mixed gas represented by percentage and Y is a ion dose of phosphorus to be implanted into said semiconductor film.

9. A method according to claim 6, wherein said passivation film has a thickness in the range of 10 to 170 nm.

10. A method according to claim 6, wherein said polycrystalline semiconductor film of n-type conductivity is fabricated without any annealing steps at a temperature of 450° C. or higher after said ion implantation step.

11. A method for producing a polycrystalline semiconductor film of p-type conductivity, comprising the steps of:

forming a semiconductor film on a substrate;

forming a passivation film on said semiconductor film;

exciting a mixed gas including hydrogen and an element of the group III of the periodic table to generate hydrogen ions and ions of said element; and implanting said hydrogen into said semiconductor film through said passivation film and simultaneously implanting said ions of said element into said semiconductor film through said passivation film in order to activate said ions of said element.

12. A method according to claim 11, wherein said element includes boron.

13. A method according to claim 11, wherein said polycrystalline semiconductor film of p-type conductivity is fabricated without any annealing steps at a temperature of 450° C. or higher after said ion implantation step.

14. A method for fabricating a thin film transistor, comprising the steps of:

forming a polysilicon film on an insulating substrate;

forming a passivation film on said polysilicon film;

exciting a mixed gas including hydrogen and at least one element selected from the group consisting of the III, IV, and V groups of the periodic table to generate hydrogen ions and ions of said at least one element; and implanting said hydrogen ions into said semiconductor film through said passivation film and simultaneously implanting said ions of said at least one element into said semiconductor film through said passivation film in order to form at least one of a source and a drain in said polysilicon film.

15. A method according to claim 14, said insulating substrate is made of glass having a deforming point temperature in the range of 450° to 600° C.

16. A method according to claim 14, wherein said thin film transistor is fabricated without any annealing steps at a temperature of 450° C. or higher after the ion implantation step.

17. A method according to claim 14, the method further comprising the steps of:

forming a gate electrode on a gate insulating film after forming said passivation film; and implanting hydrogen ions of a dose in the range of $2 \times 10^{15}$ ions/cm$^2$ to $2 \times 10^{16}$ ions/cm$^2$ into a portion of the polysilicon film under said gate electrode after said ion implantation step.

18. A method according to claim 17, wherein a gate bus line is simultaneously formed with said gate electrode in said step of forming said gate electrode.

* * * * *

UNITED STATES PATENT AND TRADEMARK OFFICE

CERTIFICATE OF CORRECTION

PATENT NO. : 5,403,756

DATED : April 4, 1995

INVENTOR(S) : Atsushi Yoshinouchi, Tatsuo Morita, Shuhei Tsuchimoto, Yasuaki Murata It is certified that error appears in the above-identified patent and that said Letters Patent is hereby corrected as shown below:

```
Column 3, line 14:  reads "400C", should read --400°C--

Column 3, line 18:  reads "600C", should read --600°C--

Column 11, line 51: reads "0.6", should read --0.5--.
```

Signed and Sealed this

First Day of August, 1995

Attest:

BRUCE LEHMAN

Attesting Officer   Commissioner of Patents and Trademarks